(12) United States Patent
Cahan et al.

(10) Patent No.: US 10,752,787 B2
(45) Date of Patent: Aug. 25, 2020

(54) TAILORABLE SURFACE TOPOLOGY FOR ANTIFOULING COATINGS

(71) Applicants: International Business Machines Corporation, Armonk, NY (US); Agency for Science, Technology and Research, Singapore (SG)

(72) Inventors: Amos Cahan, Netaim (IL); Xin Ding, Singapore (SG); Mareva B. Fevre, Oakland, CA (US); James L. Hedrick, Pleasanton, CA (US); Zhen Chang Liang, Singapore (SG); Nathaniel H. Park, San Jose, CA (US); Theodore G. van Kessel, Millbrook, NY (US); Rudy J. Wojtecki, San Jose, CA (US); Yi Yan Yang, Singapore (SG)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/675,754

(22) Filed: Nov. 6, 2019

(65) Prior Publication Data
US 2020/0071541 A1 Mar. 5, 2020

Related U.S. Application Data

(62) Division of application No. 15/671,693, filed on Aug. 8, 2017.

(51) Int. Cl.
*C09D 5/14* (2006.01)
*C09D 161/22* (2006.01)
(Continued)

(52) U.S. Cl.
CPC ............... *C09D 5/14* (2013.01); *A01N 25/10* (2013.01); *A01N 31/16* (2013.01); *A01N 33/08* (2013.01);
(Continued)

(58) Field of Classification Search
CPC ........ A01N 33/10; A01N 25/10; A01N 33/08; B05D 1/02; B05D 1/005; B05D 5/02; B29C 39/38
See application file for complete search history.

(56) References Cited

U.S. PATENT DOCUMENTS 3,697,402 A * 10/1972 Kehr et al. ......... C08G 18/6715
522/23
4,565,740 A 1/1986 Golander et al.
(Continued)

FOREIGN PATENT DOCUMENTS

CA   2588832 A1   5/2006
EP   0346058 A1   12/1989
(Continued)

OTHER PUBLICATIONS

A. J. Domb, I. Yudovin-Farber, J. Golenser, N. Beyth, E. I. Weiss, QuaternaryAmmonium Polyethyleneimine: Antibacterial Activity. J. Nanomater. 2010, 2010, DOI 10.1155/2010/826343, 13 pages.
(Continued)

*Primary Examiner* — Nahida Sultana
(74) *Attorney, Agent, or Firm* — Cantor Colburn LLP; Vazken Alexanian

(57) ABSTRACT

Embodiments are directed to a method of making an antifouling and bactericidal coating with tailorable surface topology. The method includes depositing a layer of branched polyethyleneimine (BPEI) and diamino-functionalized poly(propylene oxide) (PPO) in a mixture of water and organic solvent on a substrate to form a layer of
(Continued)

BPEI/PPO. The method includes depositing a layer of glyoxal in a water-containing solution on the layer of BPEI/PPO. The method further includes curing the layer of BPEI/PPO and layer of glyoxal to form a homogenous, glyoxal crosslinked BPEI/PPO coating, where the curing induces local precipitation and alteration of the glyoxal crosslinked BPEI/PPO coating to provide a textured surface.

20 Claims, 10 Drawing Sheets

(51) Int. Cl.
| | |
|---|---|
| A01N 33/08 | (2006.01) |
| A01N 31/16 | (2006.01) |
| C09D 181/02 | (2006.01) |
| A01N 33/10 | (2006.01) |
| B05D 1/02 | (2006.01) |
| B05D 1/00 | (2006.01) |
| B29C 39/38 | (2006.01) |
| B29C 39/26 | (2006.01) |
| A01N 25/10 | (2006.01) |
| C09D 5/16 | (2006.01) |
| G03F 7/00 | (2006.01) |
| B05D 5/02 | (2006.01) |

(52) U.S. Cl.
CPC ............ *A01N 33/10* (2013.01); *B05D 1/005* (2013.01); *B05D 1/02* (2013.01); *B29C 39/26* (2013.01); *B29C 39/38* (2013.01); *C09D 5/1681* (2013.01); *C09D 161/22* (2013.01); *C09D 181/02* (2013.01); *G03F 7/0002* (2013.01); *B05D 5/02* (2013.01); *B29K 2995/0025* (2013.01); *B29K 2995/0041* (2013.01)

(56) References Cited

U.S. PATENT DOCUMENTS

| | | | |
|---|---|---|---|
| 5,213,898 | A | 5/1993 | Larm et al. |
| 8,337,792 | B2 | 12/2012 | Westlund et al. |
| 8,895,354 | B2 | 11/2014 | Kugler et al. |
| 9,018,172 | B2 | 4/2015 | Pentelute et al. |
| 9,109,140 | B2 | 5/2015 | Dooley |
| 9,381,276 | B1 | 7/2016 | Joseph et al. |
| 9,399,044 | B2 | 7/2016 | Cheng et al. |
| 10,006,936 | B2 | 6/2018 | Boday et al. |
| 10,563,069 | B2 | 2/2020 | Cahan et al. |
| 2003/0194504 | A1 | 10/2003 | Bilyk et al. |
| 2008/0241557 | A1 | 10/2008 | Hoshi et al. |
| 2011/0086172 | A1 | 4/2011 | Snow |
| 2011/0171279 | A1 | 7/2011 | Chisholm et al. |
| 2012/0058355 | A1 | 3/2012 | Lee et al. |
| 2013/0302873 | A1 | 11/2013 | Singh et al. |
| 2014/0004170 | A1 | 1/2014 | Kronen et al. |
| 2014/0010983 | A1 | 1/2014 | Gorodisher |
| 2014/0113871 | A1 | 4/2014 | Pentelute et al. |
| 2014/0242866 | A1 | 8/2014 | Locklin |
| 2014/0319044 | A1 | 10/2014 | Giannellis et al. |
| 2014/0342954 | A1 | 11/2014 | Ingber et al. |
| 2014/0369953 | A1 | 12/2014 | Purschwitz et al. |
| 2015/0093425 | A1 | 4/2015 | Moore |
| 2015/0148903 | A1 | 5/2015 | Robeson et al. |
| 2015/0249137 | A1 | 9/2015 | Katsuhara et al. |
| 2015/0328378 | A1 | 11/2015 | Schaer et al. |
| 2015/0369771 | A1 | 12/2015 | Richardson-Burns et al. |
| 2016/0002103 | A1 | 1/2016 | Wang et al. |
| 2016/0165926 | A1 | 6/2016 | Medoff |
| 2016/0200967 | A1 | 7/2016 | Mahoney et al. |
| 2016/0228574 | A1 | 8/2016 | Farokhzad et al. |
| 2016/0237305 | A1 | 8/2016 | Advincula et al. |
| 2018/0163020 | A1 | 6/2018 | Zong et al. |
| 2018/0282556 | A1* | 10/2018 | Cahan ............... C09D 5/14 |
| 2018/0303979 | A1 | 10/2018 | Cahan et al. |
| 2019/0048208 | A1 | 2/2019 | Cahan et al. |
| 2019/0048226 | A1 | 2/2019 | Cahan et al. |
| 2019/0144610 | A1* | 5/2019 | Moser ............... C09K 3/1012 522/24 |
| 2019/0313642 | A1 | 10/2019 | Lienkamp et al. |
| 2020/0046886 | A1 | 2/2020 | Cahan et al. |
| 2020/0071542 | A1 | 3/2020 | Cahan et al. |
| 2020/0071543 | A1 | 3/2020 | Cahan |

FOREIGN PATENT DOCUMENTS

| | | |
|---|---|---|
| EP | 2289971 A1 | 3/2011 |
| EP | 2350116 A1 | 8/2011 |
| WO | 2008106194 A1 | 9/2008 |
| WO | 2010038040 A1 | 4/2010 |
| WO | 2014120095 A1 | 8/2014 |
| WO | 2014152423 A1 | 9/2014 |

OTHER PUBLICATIONS

Banerjee et al., "Antifouling Coatings: Recent Developments in the Design of Surfaces That Prevent Fouling by Proteins, Bacteria, and Marine Organisms", Advanced Materials, 23(6), 2011, pp. 690-718.
Behlau, I., Mukherjee, K., Todani, A. et al. (2011). Biocompatibility and biofilm inhibition of N, N-hexyl, methyl-polyethylenimine bonded to Boston Keratoprosthesis materials. Biomaterials, 32(34), 32 pages.
Blanchemain et al., "Vascular prostheses with controlled release of antibiotics: Part 1: Surface modification with cyclodextrins of PET prostheses", Biomolecular Engineering, 24(1), 2007, pp. 149-153.
C. Tedjo, "Bacteria-surface interaction in the presence of proteins and surface attached poly(ethylene glycol) methacrylate chains", Journal of Biomedical Materials Research Part A, 82(2), 2007, pp. 479-491.
Cheng et al., "Broad-Spectrum Antimicrobial/Antifouling Soft Material Coatings Using Poly(ethylenimine) as a Tailorable Scaffold", Biomacromolecules, 16(7), 2015, pp. 1967-1977.
Davies, D., "Understanding biofilm resistance to antibacterial agents", Nature Reviews Drug discovery, 2(2), 2003, pp. 114-122.
De Prijck, K., De Smet, N., Coenye, T. et al. (2010). Prevention of Candida albicans biofilm formation by covalently bound dimethylaminoethylmethacrylate and polyethylenimine. Mycopathologia, 170(4), 213-221.
Dong et al., "SuFEx-Based Synthesis of Polysulfates", Angewandte Chemie International Edition, 53 (36), 2014, pp. 9466-9470.
Eckhardt et al., "Nanobio Silver: Its Interactions with Peptides and Bacteria, and Its Uses in Medicine", Chemical Reviews, 113(7), 2013, pp. 4708-4754.
Faris, A. H., Rahim, A. A., Ibrahim, M. N. M. et al. (2016). Combination of lignin polyol-tannin adhesives and polyethylenimine for the preparation of green water-resistant adhesives. Journal of Applied Polymer Science, 133(20), 6 pages.
Garcia et al., "Meisenheimer Complex Inspired Catalyst- and Solvent-Free Synthesis of Noncyclic Poly(aryl ether sulfone)s", Macromolecules, 47(23), 2014, pp. 8131-8136.
George, S. (2015). Nanomaterial Properties: Implications for Safe Medical Applications of Nanotechnology. Nanotechnology in Endodontics, 45-69.
Hall-Stoodley et al., "Bacterial biofilms: from the natural environment to infectious diseases", Nature Reviews Microbiology, 2(2), Feb. 2004, pp. 95-108.
Han et al., "Synthesis of fluorinated monomer and formation of hydrophobic surface therefrom," RSC Adv., 5, 2015, pp. 22847-22855.
Hasan et al., "Antibacterial surfaces: the quest for a new generation of biomaterials", Trends in Biotechnology, 31(5), May 2013, pp. 295-304.
He et al., "Synthesis and Characterization of Amphiphilic Monodisperse Compounds and Poly(ethylene imine)s: Influence of Their Microstructures on the Antimicrobial Properties", Biomacromolecules, 13(3), 2012, pp. 612-623.

(56) References Cited

OTHER PUBLICATIONS

Higashihara et al., "Recent Progress in High Refractive Index Polymers", Macromolecules, 48(7), 2015, pp. 1915-1929.
Ishikawa "Superbases for Organic Synthesis: Guanidines, Amidines, Phosphazenes and Related Organocatalysts," Wiley Publication, Mar. 2009, 340 pages.
Khalil et al., "Synergy between Polyethylenimine and Different Families of Antibiotics against a Resistant Clinical Isolate of Pseudomonas aeruginosa", Antimicrobial Agents and Chemotherapy, 52(5), May 2008, pp. 1635-1641.
Khan, S., Ul-Islam, M., Ullah, M. W. et al. (2015). Synthesis and characterization of a novel bacterial cellulose-poly (3,4-ethylenedioxythiophene)-poly (styrene sulfonate) composite for use in biomedical applications. Cellulose, 22(4), 2141-2148.
Kondoh, A., Yorimitsu, H., & Oshima, K. (2006). Nucleophilic aromatic substitution reaction of nitroarenes with alkyl-or arylthio groups in dimethyl sulfoxide by means of cesium carbonate. Tetrahedron, 62(10), 2357-2360.
Koplin et al., "Evaluation of the Antimicrobial Activity of Cationic Polyethylenimines on Dry Surfaces", Biotechnology Progress, 24(5), 2008, pp. 1160-1165.
Kumar et al., "Significance of microbial biofilms in food industry: a review", International Journal of Food Microbiology, 42(1), 1998, pp. 9-27.
Lander et al., "Extracytoplasmic Stress Responses Induced by Antimicrobial Cationic Polyethylenimines", Current Microbiology, 65(5), 2012, pp. 488-492.
List of IBM Patents or Patent Applications Treated as Related; (Appendix P), filed Nov. 6, 2019, 2 pages.
Liu et al., "Antimicrobial and Antifouling Hydrogels Formed In Situ from Polycarbonate and Poly(ethylene glycol) via Michael Addition", Advanced Materials, 24(48), 2012, pp. 6484-6489.
M. Charnley et al., "Designed polymer structures with antifouling-antimicrobial properties", Reactive & Functional Polymers, 71(3), 2011, pp. 329-334.
M. M. Azevedo et al., "Polyethyleneimine and polyethyleneimine-based nanoparticles: novel bacterial and yeast biofilm inhibitors", Journal of Medical Microbiology, 63(9), 2014, pp. 1167-1173.
Matsumura et al., "Synthesis and Properties of Novel Aromatic Poly(thioether-ketone)s as Sulfur-Containing High-Performance Polymers", Macromolecules, 34(9), 2001, pp. 2848-2853.
McBain et al., "Microbial Characterization of Biofilms in Domestic Drains and the Establishment of Stable Biofilm Microcosms", Applied and Environmental Microbiology, 69(1), Jan. 2003, pp. 177-185.
Nakagawa et al. "Synthesis of Highly Refractive Poly(phenylene thioether) Derived from 2,4-Dichloro-6-alkylthio-1,3,5-triazines and Aromatic Dithiols", Macromolecules, 44(23), 2011, pp. 9180-9186.

Nakagawa et al., "Synthesis of highly refractive poly(phenylene thioether)s containing a binaphthyl or diphenylfluorene unit", Polymer Chemistry, 3, 2012, pp. 2531-2536.
Notification of Transmittal of the International Search Report and the Written Opinion of the International Searching Authority, International Application No. PCT/IB2018/052075, dated Jul. 26, 2018, 12 pgs.
O'Shea, J. P., Solovyeva, V., Guo, X. et al. (2014). Sequence-controlled copolymers of 2, 3, 4, 5-pentafluorostyrene: mechanistic insight and application to organocatalysis. Polymer Chemistry, 5(3), pp. 698-701.
Peraro, L., Siegert, T. R., & Kritzer, J. A. (2016). Chapter Fourteen—Conformational Restriction of Peptides Using Dithiol Bis-Alkylation. Methods in Enzymology, 580, pp. 303-332.
Price et al., "Controlled release of antibiotics from coated orthopedic implants", Journal of Biomedical Materials Research Part A, 30(3), 1996, pp. 281-286.
Raad, I., Hachem, R., Zermeno, A. et al. (1996). Silver iontophoretic catheter: A prototype of a long-term antiinfective vascular access device. Journal of Infectious Diseases, 173(2), pp. 495-498.
Sahiner et al., "The synthesis of desired functional groups on PEI microgel particles for biomedical and environmental applications", Applied Surface Science, 354, 2015, pp. 380-387.
Samberg et al., "Silver Nanoparticles in Biomedical Applications", Nanotoxicology: Progress toward Nanomedicine, CRC Press, 2014, pp. 405-421.
Schachter, B., "Slimy business—the biotechnology of biofilms", Nature Biotechnology, 21(4), Apr. 2003, pp. 361-365.
Secinti, K. D., Ayten, M., Kahilogullari, G. et al. (2008). Antibacterial effects of electrically activated vertebral implants. Journal of Clinical Neuroscience, 15(4), pp. 434-439.
Seesukphronrarak et al., "Synthesis of Fluorene-Based High Performance Polymers. I. Poly(arylene thioether)s with Excellent Solubility and High Refractive Index", Journal of Polymer Science Part A: Polymer Chemistry, 45(14), 2007, pp. 3073-3082.
Shapiro, J. A., "Thinking about bacterial populations as multicellular organisms", Annual Reviews in Microbiology, 52(1), 1998, pp. 81-104.
Stoodley, P., & Lappin-Scott, H. M. (1997). Influence of electric fields and pH on biofilm structure as related to the bioelectric effect. Antimicrobial agents and chemotherapy, 41(9), 1876-1879.
Voo et al., "Antimicrobial coatings against biofilm formation: the unexpected balance between antifouling and bactericidal behavior", Polymer Chemistry, 7(3), 2016, pp. 656-668.
Wiegand et al., "Poly(ethyleneimines) in dermal applications: Biocompatibility and antimicrobial effects", International Journal of Pharmaceutics, 456(1), 2013, pp. 165-174.
Yatvin et al., "Durable defense: robust and varied attachment of non-leaching poly "-onium" bactericidal coatings to reactive and inert surfaces", Chemical Communications, 50(67), 2014, pp. 9433-9442.

* cited by examiner

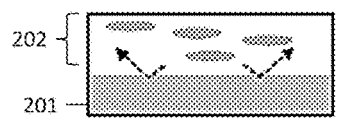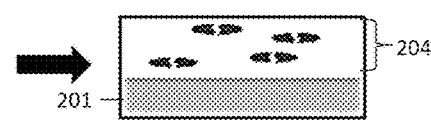
FIG. 2A                    FIG. 2B

TAILORABLE SURFACE TOPOLOGY FOR ANTIFOULING COATINGS

DOMESTIC PRIORITY

This application is a divisional of U.S. patent application Ser. No. 15/671,693, filed Aug. 8, 2017, the disclosure of which is incorporated by reference herein in its entirety.

BACKGROUND

The present invention relates in general to antifouling coatings. More specifically, the present invention relates to a tailorable surface topology for antifouling coatings.

The accumulation of microorganisms on wetted surfaces, or biofouling, is a ubiquitous problem for materials in a broad range of applications, such as medical devices, marine instruments, food processing, and even domestic drains. Generally, bacteria initiate biofouling by forming biofilms, which include highly ordered adherent colonies, commonly within a self-produced matrix of extracellular polymeric substance.

In the medical field, infection is a potential complication of implanted medical devices. Bacterial colonization and subsequent biofilm formation are difficult to diagnose and treat. Biofilms are a primary cause of persistent infections because of their resistance to antibiotics, potential release of harmful toxins, and ability to spread microorganisms. Biofilms can also cause implantable devices to malfunction.

Often, extreme measures, such as removal of the infected device from the patient's body, are the only viable management option. Although disinfection techniques and prophylactic antibiotic treatment are used to prevent colonization during procedures, such practices are not completely effective in preventing perioperative bacterial colonization. Moreover, the risk of bacterial colonization on, for example, a prosthetic joint can be present even long after it has been implanted. The use of implantable devices, such as prosthetic joints, heart valves, artificial hearts, vascular stents and grafts, cardiac pacemakers and defibrillators, nerve stimulation devices, gastric pacers, vascular catheters and ports (e.g., Port-A-Cath)) is growing, and therefore, the number of immunocompromised patients resulting from advanced therapeutics is also growing.

For a variety of reasons, antibiotic treatments to eliminate colonization and infection associated with implantable substances and devices can be limited in their ability to eradicate bacteria and fungi involved in the above processes. For example, antibiotic concentrations can be reduced deep inside the biofilm due to limited diffusion. Antibiotics also may be unable to generally eliminate "the last" pathogen cells, which is typically accomplished by the immune system that also may not optimally function in the presence of implantable devices. Microorganisms also possess the ability to persist, i.e., to become metabolically inactive and thus functionally relatively resistant to antibiotics. The pandemic of antibiotic resistance makes treating device-associated infections even more challenging. In fact, antibiotic resistance is frequently encountered with microorganisms that cause device-associated infections (e.g., Enterococci and Staphylococci). Therefore, there is a clear need for means and methods to prevent the formation of biofilms on implantable devices.

Consequently, considerable efforts were dedicated, in recent years, to developing antibacterial surfaces. Such surfaces can be classified into two categories: (i) antifouling surfaces that prevent the adhesion of microorganisms, and (ii) bactericidal surfaces that trigger bacteria killing.

Typical strategies for the design of antibacterial surfaces involve either supramolecular (non-covalent) coating of the surface or modification of the surface (i.e., chemical modification or structuring). Antifouling properties are commonly obtained by the incorporation of, for example, oligo or poly(ethylene glycol) (PEG) to increase hydrophilicity and resist bacteria attachment. Bactericidal characteristics, on the other hand, may be obtained by functionalization with releasable bacteria-killing substances, such as silver nanoparticles (Ag NPs) and antibiotics, or decoration with contact-killing bactericidal moieties like quaternary ammonium salts. Current technologies, however, suffer several shortcomings including, just to name a few, long-term antibacterial performances and stability, development of bacterial resistance, and scalability to an industrial setting. While bacterial cell lysis on biocide-functionalized surfaces reduces the rate of biofilm formation, recent reports evidenced that a combination of both antifouling and bactericidal properties was necessary to insure long-term efficacy of the surfaces.

An environmentally friendly and easy to process method for protecting surfaces and devices for prolonged periods of time using an antimicrobial/antifouling strategy to prevent biofilm formation remains a technologic and scientific challenge.

SUMMARY

Embodiments of the present invention are directed to a method of making an antifouling and bactericidal coating with tailorable surface topology. The method includes depositing a layer of branched polyethyleneimine (BPEI) and diamino-functionalized poly(propylene oxide) (PPO) in a mixture of water and organic solvent on a substrate to form a layer of BPEI/PPO. The method includes depositing a layer of glyoxal in a water-containing solution on the layer of BPEI/PPO. The method further includes curing the layer of BPEI/PPO and layer of glyoxal to form a homogenous, glyoxal crosslinked BPEI/PPO coating, where the curing induces local precipitation and alteration of a surface topology of the glyoxal crosslinked BPEI/PPO coating to provide a textured surface. Advantages of the textured surface include providing an antifouling and bactericidal coating.

According to one or more embodiments, a method of making an antifouling coating with tailorable surface topology includes providing a mold with a pattern of indentions and protrusions. The method includes forming a layer of fluorinated polythioaminal on the pattern of indentions and protrusions of the mold. The method further includes heating the layer of fluorinated polythioaminal to induce crosslinking and transfer the pattern into the layer of fluorinated polythioaminal. The method further includes removing the mold from the layer of fluorinated polythioaminal, the layer of fluorinated polythioaminal including a negative pattern of the mold. Advantages of the method include being able to easily form a surface with a highly fluorinated antifouling network that is based on a negative pattern of the mold.

According to one or more embodiments, a method of making an antifouling coating with a textured surface includes forming a fluorinated polythioether by a nucleophilic aromatic substitution reaction. The method further includes curing the polythioether to provide a film that is semi-crystalline or crystalline. Advantages of the method include the ability to rapidly develop a broad array of new hydrophobic materials.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts an antifouling property of a coating according to embodiments of the invention;

FIG. 2B depicts a bactericidal property of a coating according to embodiments of the invention;

Figure 1:
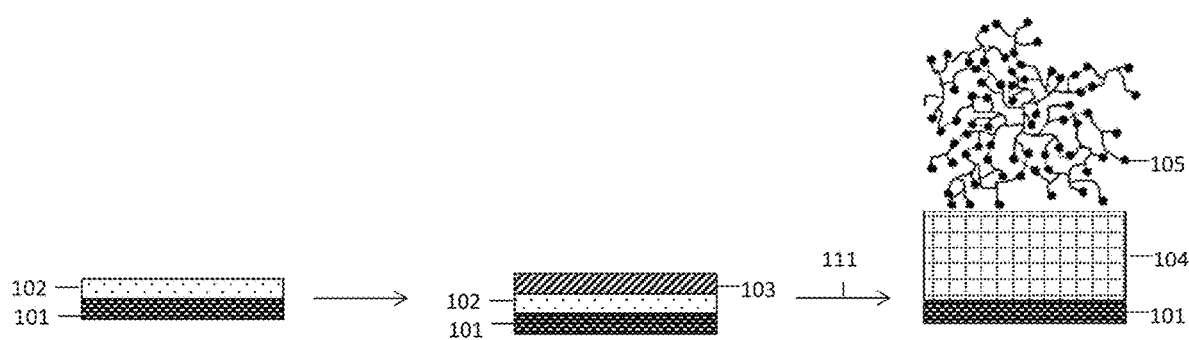
FIG. 1 depicts methods for forming a coating according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Turning now to an overview of technologies that are more specifically relevant to aspects of the invention, embodiments of the invention relate to systems and methods for preventing and/or treating bacterial colonization, biofilm formation, or infection involving an implantable medical device. Current technologies, as mentioned above, suffer several shortcomings, including long-term antibacterial performance and stability, development of bacterial resistance, and scalability to an industrial setting. Furthermore, while bacterial cell lysis on biocide-functionalized surfaces reduces the rate of biofilm formation, recent reports evidenced that a combination of both antifouling and bactericidal properties was necessary to insure long-term efficacy of the surfaces.

Turning now to an overview of the aspects of the invention, embodiments of the invention address the above-described shortcomings of the prior art by providing an antimicrobial/antifouling coating that is obtained by texturing the surface (or altering the surface topology) of an implantable medical device either prior or post-polymerization/curing. Various embodiments include surface texturing of a crosslinked polyethyleneimine (PEI)-glyoxal coating obtained by layer-by-layer spray coating, surface texturing of a hydrophobic (fluorinated) thioaminal network obtained by nano-imprinting while curing, and surface texturing of a hydrophobic (fluorinated) thermoplastic material induced by crystallization, post or during synthesis. These methods offer a technology platform to more diverse, versatile, economical and large-scale applications for antimicrobial materials.

Implantable medical devices to which a coating (film or layer) of the present invention can be applied include, but are not limited to, a prosthetic joint, a vascular line, stent or graft, a venous filter, a tooth implant, a cochlear implant, a metal used for bone fracture internal fixation, a urinary catheter, a ventriculoperitoneal shunt, a cardiac or nerve pacemaker, a heart valve, or a ventricular assist device.

The above-described aspects of the invention address the shortcomings of the prior art by offering a technology platform to more diverse, versatile, economical and large-scale applications for antimicrobial materials.

Turning now to a more detailed description of aspects of the present invention, FIG. 1 depicts methods for forming a homogenous coating according to embodiments of the invention. Surface texturing induced by micro-precipitation or nano-precipitation in the solvent mixture is used for curing a crosslinked coating, which is described in further detail below.

Poly(ethylene imine) (PEI) is an antimicrobial that kills bacteria in a contact-killing faction (i.e., without release of toxic moieties from the surface). PEI has amines (tertiary, secondary, and primary) available for attachment of functional groups. However, when used as a coating, PEI may not exhibit long-term efficacy, like other antimicrobial materials. PEI nanoparticles, crosslinked by reductive amination or nucleophilic substitution, are efficient antimicrobial agents. Conventional methods for incorporating PEI antimicrobial materials, however, include multistep-modification procedures, rely on harsh, environmentally unfriendly processing, and/or lack a scalable deposition method applicable to an industrial setting. Furthermore, when used as a coating, PEI suffers, like many antimicrobial materials, from poor long-term efficacy.

Therefore, according to one or more embodiments, branched PEI (BPEI) and amino-functionalized poly(propylene oxide) (PPO) are crosslinked at the surface of a substrate using its available primary amines, which are reacted with glyoxal. The reaction of primary amines with glyoxal can lead to a mixture of products (α-hydroxy amine (1), imine (2), and 4/1 adducts (3)) as depicted in Scheme 1 below.

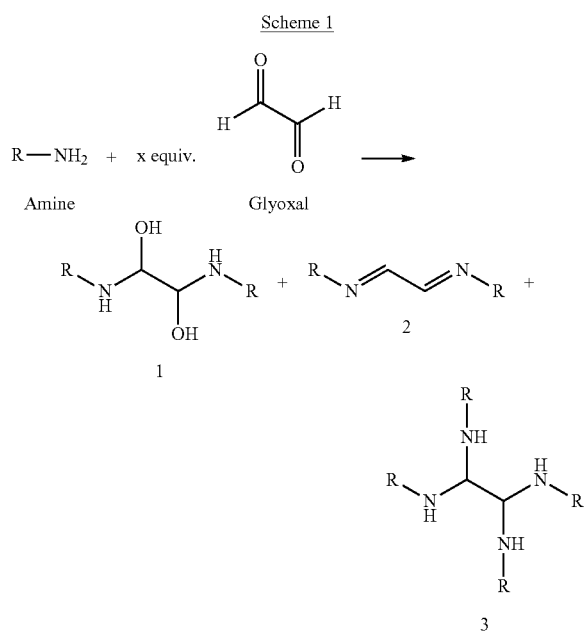

The occurrence of each product depends on the nature of the amine, stoichiometry, solvent and temperature. In model studies performed at room temperature and analyzed by nuclear magnetic resonance spectroscopy (NMR), the major product observed is the bis-imine product (2). However, traces of another product attributed to the presence of product (3) were observed while varying the stoichiometry. As the coating is cured at elevated temperature after deposition, to remove the solvent and allow for maximum crosslinking density, the ratio of product (2) to product (3) should decrease in the final material.

In some embodiments, BPEI, PPO, and glyoxal are deposited from water-containing solutions. Advantageously, this approach allows for a more environment-friendly process. Most interestingly, the reaction of BPEI with glyoxal is very fast and leads to an immediate gelation of the reaction medium when mixing aqueous solutions of BPEI at a concentration of greater than about 25 weight percent and glyoxal at a concentration of greater than about 5 weight percent. Taking advantage of this fast gelation, a layer-by-layer process can be achieved.

FIG. 1 illustrates a cross-sectional view of a structure having a first BPEI/PPO layer 102 formed on a substrate 101. The first BPEI/PPO layer 102 is viscous enough to allow for good coverage of the substrate 101 surface. A first glyoxal layer 103 is formed on a surface of the first BPEI/PPO layer 102. The first BPEI/PPO layer 102 and the first glyoxal layer 103 can be formed or deposited over the substrate 101 using any suitable process, such as, for example, deposition by dip-coating or spray-coating.

According to one or more embodiments, the first BPEI/PPO layer 102 and first glyoxal layer 103 are successively sprayed onto the substrate 101 (e.g., APTES-functionalized glass substrate) from nozzles positioned over the substrate 101 at a distance of about 15 centimeters at a pressure of about 25 psi.

Additional alternating layers of BPEI, BPEI/PPO, and glyoxal can be formed on the substrate 101 in a similar manner. The total number of deposited layers is chosen depending on the desired thickness of the final coating. One or more additional layer of each of BPEI, BPEI/PPO, or glyoxal can be deposited before curing. In some embodiments, the structure is formed from a single layer of BPEI/PPO and glyoxal (2 total layers). In other embodiments, four (4) or nine (9) layers are used, although other thicknesses (and consequently, total number of layers) are within the contemplated scope of the invention. In some embodiments, depending on the concentration of the BPEI/PPO layers, the concentration of the glyoxal layers, and the temperature (e.g., for solutions having greater than about 25 wt % BPEI and 5 wt % glyoxal at a temperature of about 20 degrees Celsius), immediate gelation is observed.

After depositing the layers of BPEI, BPEI/PPO, and glyoxal, the coating is cured 111 to remove water (and/or solvent) and form a homogenous coating 104 with BPEI-glyoxal crosslinks 105. In some embodiments, the first BPEI layer 102 and the first glyoxal layer 103 are cured at a temperature of about 30 degrees Celsius for about 1 hour. In some embodiments, the first BPEI layer 102 and the first glyoxal layer 103 are cured at a gradually increasing temperature of about 30 to about 120 degrees Celsius over about 1 hour. In some embodiments, the first BPEI layer 102 and the first glyoxal layer 103 are cured at a temperature of about 120 degrees Celsius for about 1 hour. In some embodiments, a three-stage thermal treatment is used to cure: (1) a first stage cure at a temperature of 30 degrees Celsius for 1 hour; (2) a second stage cure at a gradually rising temperature of about 30 degrees Celsius to about 120 degrees Celsius over 1 hour; and (3) a third stage cure at a temperature of about 120 degrees Celsius for 1 hour. After curing, the substrate 101 is then allowed to cool down to room temperature.

The adhesion of the first BPEI or BPEI/PPO layer on the substrate 101 can be promoted either by modification of the substrate 101 or by the addition of adhesion promoter moieties. For example, the substrate 101 can be functionalized with —NH₂ moieties by condensing 3-aminopropyl) triethoxysilane (APTES) at the surface of the substrate 101. The amine moieties attached at the surface of the substrate 101 could then react with glyoxal during crosslinking. Alternatively, catechol-containing moieties can be added to the BPEI/glyoxal mixture to promote the adhesion of the crosslinked PEI/glyoxal polymer (homogenous layer 104) to the substrate 101.

The positively charged amines (quaternary amines) of BPEI (in aqueous solution) make the glyoxal-crosslinked BPEI coatings bactericidal. As depicted in FIGS. 2A and 2B, the antimicrobial properties of the coating is enhanced by nano- or micro-patterning (nano- or micro-precipitation) using selective solvents, during curing, which is described in further detail below.

To form a nano-pattern of micro-pattern, the layers forming the coating (BPEI, BPEI/PPO, and glyoxal) are deposited in solvents and mixtures of solvents that leads to phase-separation during later curing. The phase-separation during curing forms a nano-pattern or a micro-pattern of the coating on the surface of the substrate. The nanoscale and microscale patterns are due to local precipitation, wrinkling, or alteration of the surface topology. According to embodiments, curing induces local precipitation and alteration of a surface topology of the homogenous, glyoxal crosslinked BPEI coating to provide a textured surface.

As shown in FIG. 2A, the nano-patterned or micro-patterned coating 201 functions as an antifouling surface, which prevents bacteria 202 from adhering to the surface. The rough, irregular surface prevents bacteria from attaching. As shown in FIG. 2B, the coating 201 also functions as a bactericidal coating that repels bacteria. Because the polymers in the coating 201 can be positively charged by quaternization in aqueous media, they also kill bacteria on contact. When healthy bacteria 203 come into contact with the cationic coating 201, the coating kills the bacteria (resulting in dead bacteria 204).

In an exemplary embodiment, successive depositions of a solution of PEI and diamino-functionalized poly(propylene oxide) (PPO) in isopropanol and a solution of glyoxal in a mixture of isopropanol and water is used to phase separate the coating during curing. The PPO is included in the PEI solution to increase hydrophobicity and function as a phase-separator that alters the surface topology.

According to embodiments, the layers of BPEI, BPEI/PPO, and glyoxal are deposited in organic solvents and aqueous mixtures to induce precipitation upon curing. In an exemplary embodiment, a layer of BPEI in an organic solvent (e.g., isopropanol) is deposited, followed by a layer of glyoxal in organic solvent (e.g., isopropanol) and water. Local precipitation occurs during curing to alter the surface topology of the resulting coating.

According to other embodiments, surface texturing is induced by nano-imprinting of a hydrophobic material. The hydrophobic material is a fluorinated polythioaminal that is formed from the in-situ generation of a reactive amine intermediate. According to some embodiments, the polythioaminal is formed by reacting fluorinated dianilines and dithiols, in equimolar ratios, with paraformaldehyde. In-situ generation of a reactive intermediate imine further condenses with a dithiol molecule to form the fluorinated polythioaminal.

Figure 5A:
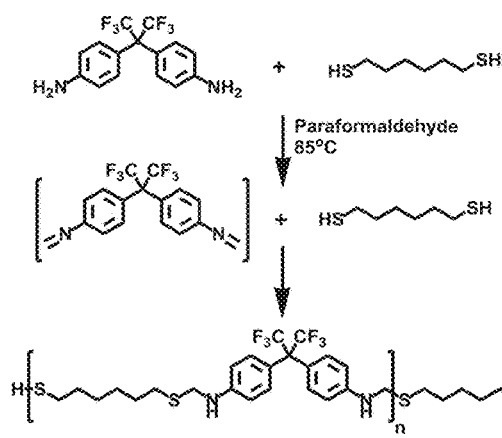
FIG. 5A depicts a reaction scheme for forming polymers according to embodiments of the invention.

FIG. 5A depicts a reaction scheme for forming a polythioaminal according to an exemplary embodiment. 4,4'-hexafluoroisopropylidene)dianiline and 1,6-hexanedithiol are reacted with an excess of paraformaldehyde. A reactive imine intermediate condenses with a dithiol to form a fluorinated polythioaminal.

At low temperatures, only linear polythioaminals are produced, but as the temperature is increased, the multiple substitutions occur at the nitrogen positions to form a cross-linked network. These properties allow the polythioaminals to be textured on a substrate using imprint lithography (or nanoimprint lithography). A linear polymer is deposited onto a substrate, and then heated to form the permanent network that takes the shape of substrate.

As mentioned above, the polythioaminals can be textured on a substrate using nanoimprint lithography, which is a method of fabricating nanometer scale patterns. Generally, nanoimprint lithography creates patterns by mechanical deformation of imprint resist and subsequent processes. Generally, the imprint resist is a polymer formulation that is cured by heat or ultraviolet light during the imprinting. Adhesion between the resist and the template is controlled to allow proper release.

Figure 6A:
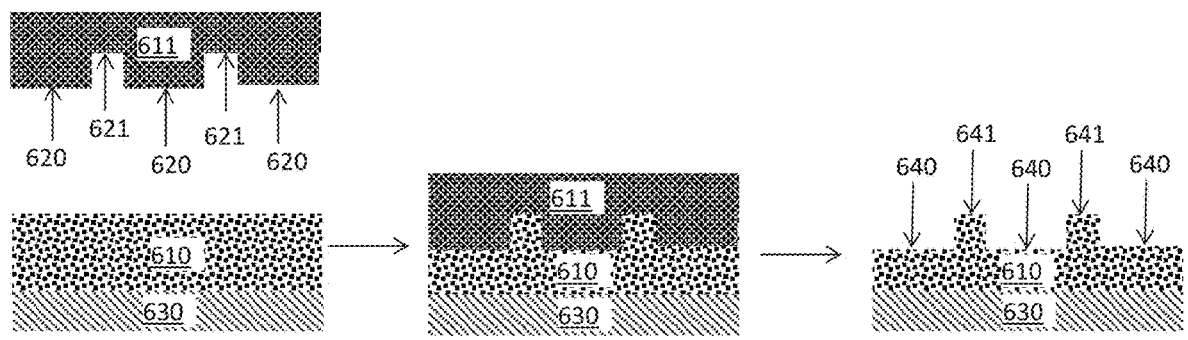
FIG. 6A depicts a method for forming a material according to embodiments of the invention.

FIG. 6A depicts a method for forming a nanoscale pattern of a polythioaminal coating according to embodiments. A mold 611 having a pattern of a plurality of protrusions 620 and indentions 621 is provided and disposed onto a layer of polythioaminal 610 arranged on a substrate 630. The polythioaminal 610 is heated, and the mold 611 is removed to transfer the pattern to the layer of polythioaminal, which then includes a plurality of protrusions 641 and indentions 640 that mirror the pattern of the mold 611 (a negative pattern of the mold). The molded/texturized layer of polythioaminal 610 after heating includes crosslinks that forms a three-dimensional network.

Figure 6B:
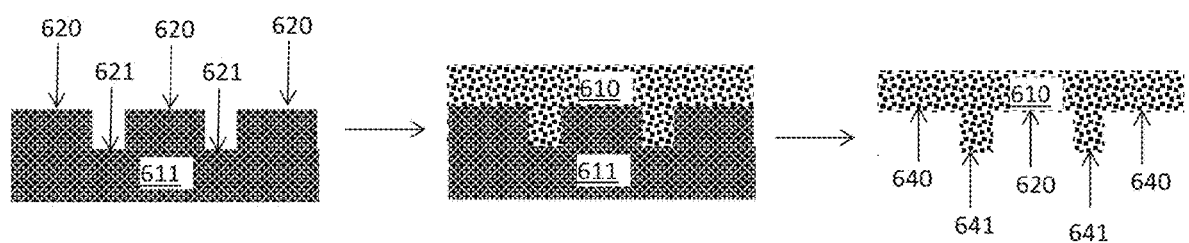
FIG. 6B depicts a method for forming a material according to embodiments of the invention.

FIG. 6B depicts a method for forming a nanoscale pattern of a polythioaminal coating according to embodiments. A mold 611 having a pattern of a plurality of protrusions 620 and indentions 621 is provided. A layer of polythioaminal 610 is disposed directly on the mold 611. The layer of polythioaminal 610 is heated, and the mold 611 is removed to transfer the pattern to the layer of polythioaminal, which then includes a plurality of protrusions 641 and indentions 640 that mirror the pattern of the mold 611 (negative pattern). The molded/texturized layer of polythioaminal 610 after heating includes crosslinks that forms a three-dimensional network.

Figure 6C:
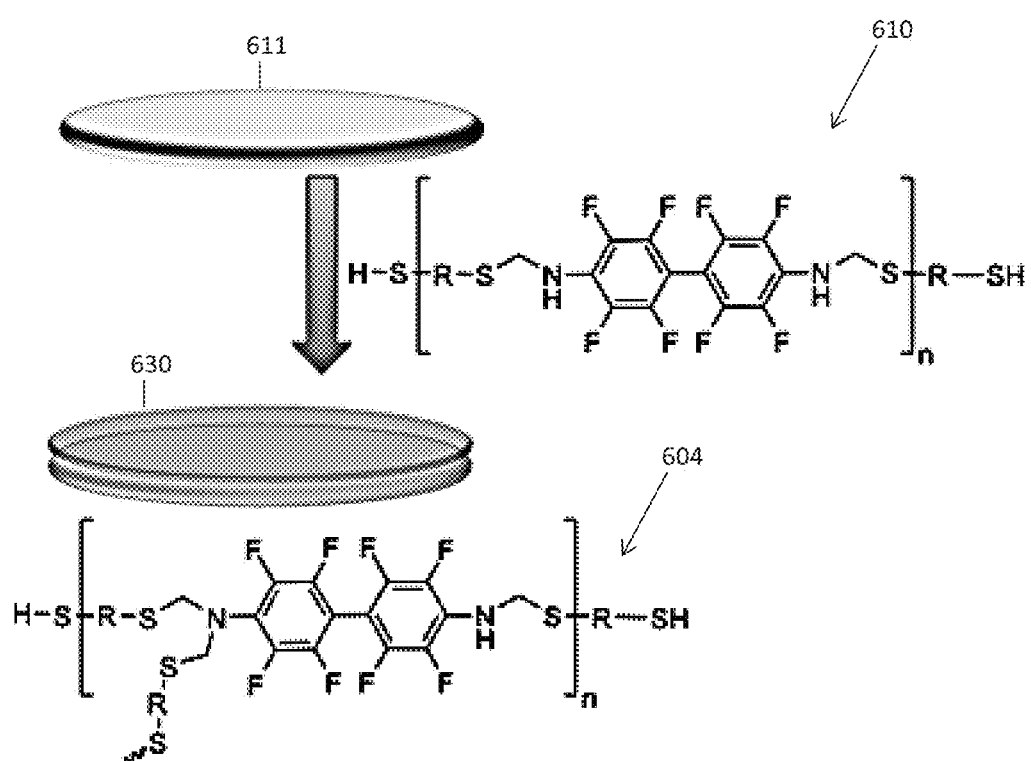
FIG. 6C depicts a method for forming a material according to embodiments of the invention.

FIG. 6C depicts a method for forming spin-coated polythioaminals and subsequent network formation according to one or more embodiments. A thin layer of the polythioaminal polymer 610 (the imprint resist) is spin-coated onto the sample substrate 630. Then the mold 611, which has predefined topological patterns, is brought into contact with the substrate having the polymer 610 disposed thereon. The mold 611 and the substrate 630 with the polymer 610 are pressed together under certain pressure. The polymer 610 is heated to a temperature above the glass transition temperature, and the pattern on the mold 611 is pressed into the softened polymer film, forming a crosslinked network that takes the shape of the mold 611. After being cooled down, the mold 611 is separated from the sample and the pattern resist is left on the substrate 630 in the polymer network 604.

The polythioaminals are linear before heating. According to one or more embodiments, the polydispersity index (PDI) of a polythioaminal is about 2 when formed at a temperature in a range from about 25 to about 100° C. After increasing the temperature to about 100 to about 200° C., the linear polymer undergoes multiple substitutions at the nitrogen group to form a cross-linked network, increasing the PDI.

These polythioaminal polymer networks can be generated with a variety of number of electron deficient diamines. According to one or more embodiments, the polythioaminal is formed from reacting substituted or unsubstituted dianiline with a dithiol in the presence of an aldehyde, for example, paraformaldehyde or formaldehyde.

As the fluorine content increases, the contact angle of the polymer network with the substrate increases. According to one or more embodiments, the contact angle of the polymer network increases to above 100°. Thus, these materials are easy to process, hydrophobic coatings.

According to one or more embodiments, surface texturing of a medical device surface is induced by crystallization of a coating, which is described in further detail below.

The development of new, implantable devices for health monitoring has the potential to revolutionize personalized medicine and disease diagnosis. However, as with many implantable materials, it is essential that they are biocompatible, particularly with regard to preventing bacterial infection and biofilm formation. To this end, highly hydrophobic surfaces have the potential to prevent bacterial adhesion and the formation of biofilms. One approach to generate hydrophobic surfaces is to coat the device with an appropriate polymeric material that is itself highly hydrophobic in nature. Such materials include polymers with high fluorine content or long alkyl chains, both of which can impart hydrophobic properties to materials.

As described herein, fluorinated polythioethers are formed via a nucleophilic aromatic substitution reaction ($SN_{Ar}$). The fluorinated polythioethers are highly hydrophobic materials that prevent bacterial adhesion and formation of biofilms.

According to one or more embodiments, the surfaces of the fluorinated polythioether materials (films or coatings) are also texturized and include surface topology such that the microbes cannot adhere and form biofilms. The texturized surfaces thus provide distinctive antifouling surfaces. The texture results from being semi-crystalline or crystalline in nature.

One method to achieve surface topology in an easy, facile and non-templating approach is to generate a semi-crystalline (or crystalline) morphology in the polymer coating. As crystals begin to grow, the surface spontaneously develops topology/roughness that precludes microbial adherence.

Scheme 2 below depicts a reaction according to embodiments of the invention. A bis-trimethylsilyl protected dithiol (A) is combined with hexafluorobenzene and an organocatalyst to form the polymer (B). Polymer (B) is a highly hydrophobic, semicrystalline material that prevents bacterial adhesion and formation of biofilms.

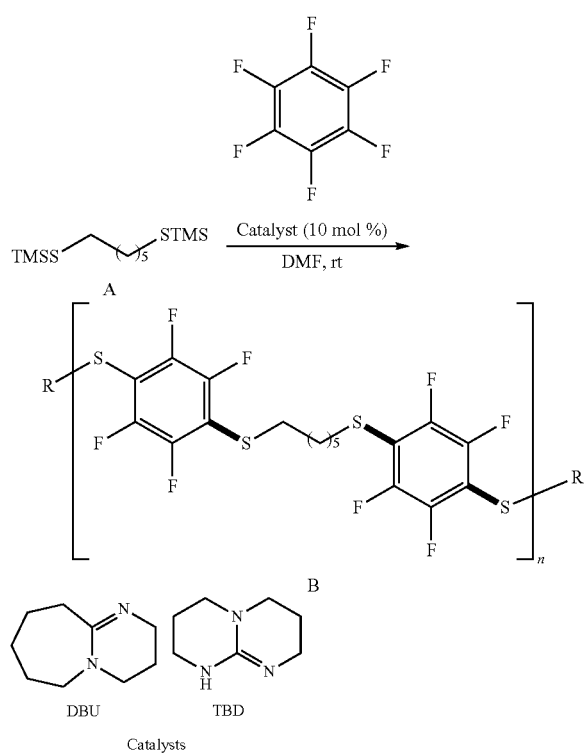

According to an exemplary embodiment, 2,2,11,11-tetramethyl-3,10-dithia-2,11-disiladodecane (A) is combined with hexafluorobenzene and triazabicyclodecene (TBD) or 1,8-diazabicyclo[5.4.0]undec-7-ene (DBU) to form a fluorinated polyether polymer (B).

The reaction and conditions shown in Scheme 2 exhibit very vast kinetics, with the reaction being complete in less than two minutes at room temperature, a distinct advantage over current methods for polythioether synthesis. Additionally, these reaction conditions allow for the incorporation of commercially available perfluoroarenes, enabling access to a diverse array of new fluoropolymers. Incorporating perfluoroarenes enables development of new, highly hydrophobic films because higher fluorine content confers increased hydrophobicity in the resultant material.

According to embodiments, a fluorinated polythioether is formed by a nucleophilic substitution reaction including a perfluoroarene, a dithiol, and an organic catalyst.

After the films are cured, contact angles with water are increased. After the films are cured, contact angles with water greater than 90° are achieved in some embodiments. After films are cured, contact angles with water greater than 95° are achieved in some embodiments. After films are cured, contact angles with water greater than 99° are achieved in some embodiments. These results demonstrate the efficacy of the polymer forming reaction for accessing new fluorinated materials and their use in hydrophobic coatings. Given the general effectiveness of these conditions for a wide variety of activated fluoroarenes and silyated thiol nucleophiles, this can allow for the rapid development of a broad range of new hydrophobic materials.

The fluorinated polythioethers are semi-crystalline (or crystalline) and opaque with a glass transition temperature ($T_g$) of about 24° C. and a melting point ($T_m$) of about 102° C. in some embodiments. In other embodiments, the fluorinated polthioethers are semi-crystalline (or crystalline) with a glass transition temperature ($T_g$) in a range of about 50 to about 200° C., and a melting point ($T_m$) in a range of about 0 to about 350° C.

According to one or more embodiments, a method of making an antifouling and bactericidal coating with tailorable surface includes depositing a layer of branched polyethyleneimine (BPEI) and diamino-functionalized poly(propylene oxide) (PPO) in an organic solvent on a substrate to form a layer of BPEI/PPO. The method includes depositing a layer of glyoxal in a water-containing solution on the layer of BPEI/PPO. The method further includes curing the layer of BPEI/PPO and layer of glyoxal to form a homogenous, glyoxal crosslinked BPEI/PPO coating. The curing induces local precipitation and alteration of a surface topology of the glyoxal crosslinked BPEI/PPO coating to provide a textured surface.

Curing the layer of BPEI/PPO and layer of glyoxal to form a homogenous, glyoxal crosslinked BPEI/PPO coating provides advantages of a coating with positively charged ammonium ions that are bactericidal.

Curing to induce local precipitation and alter a surface topology of the glyoxal crosslinked BPEI/PPO coating to provide a textured surface provides advantages of providing an irregular surface so that bacteria cannot attach.

According to one or more embodiments, a method of making an antifouling coating with tailorable surface topology includes providing a mold with a pattern of indentions and protrusions. The method further includes forming a layer of fluorinated polythioaminal on the pattern of indentions and protrusions of the mold. The method includes heating the layer of fluorinated polythioaminal to induce crosslinking and transfer the pattern into the layer of fluorinated polythioaminal. The method further includes removing the mold from the layer of fluorinated polythioaminal, the layer of fluorinated polythioaminal including a negative pattern of the mold.

Forming a layer of fluorinated polythioaminal on the pattern of indentions and protrusions of the mold and then heating the layer of fluorinated polythioaminal to induce crosslinking and transfer the pattern into the layer of fluorinated polythioaminal provides advantages of a textured surface that inhibits microbial adhesion and subsequent fouling.

According to one or more embodiments, a method of making an antifouling coating with a textured surface includes forming a fluorinated polythioether by a nucleophilic aromatic substitution reaction, and curing the polythioether to provide a film that is semi-crystalline or crystalline.

Forming a fluorinated polythioether by a nucleophilic aromatic substitution reaction occurs with very fast kinetics at room temperature, which allows incorporation of a wide array of perfluoroarenes.

EXAMPLES

Example 1

A textured surface was formed on a substrate. A solutions of PEI and diamino-functionalized poly(propylene oxide) (PPO) in isopropanol and a solution of glyoxal in a mixture of isopropanol and water were successively deposited onto a substrate and then cured. Phase-separation of the network occurred during curing due to the PPO being present in solution. Without being bound by theory, phase-separation likely occurred due to the progressive evaporation of the isopropanol solvent and immiscibility of PPO in the remaining water solvent.

Figure 3:
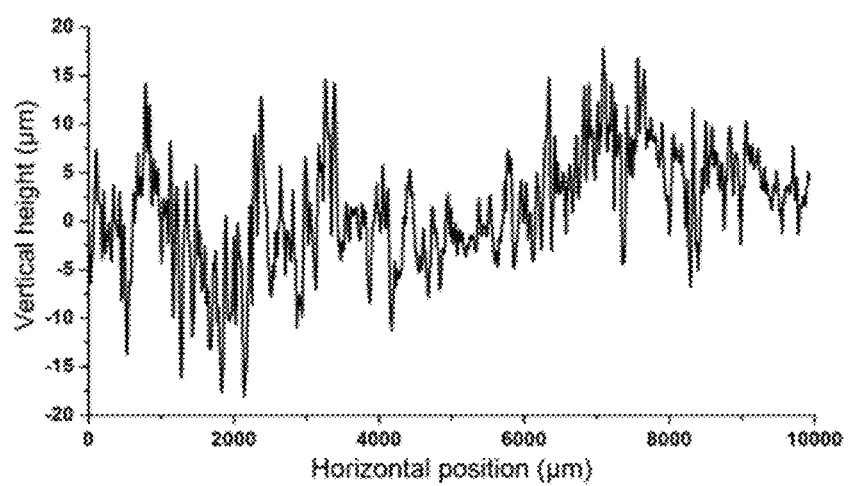
FIG. 3 depicts a profilometer trace of a coating prepared in accordance with embodiments of the invention.

FIG. 3 depicts the profilometer trace of the coating (film), which illustrates the surface's profile to quantify roughness. As shown, phase-separation resulted in a rough micro-patterned surface.

Example 2

Figure 4A:
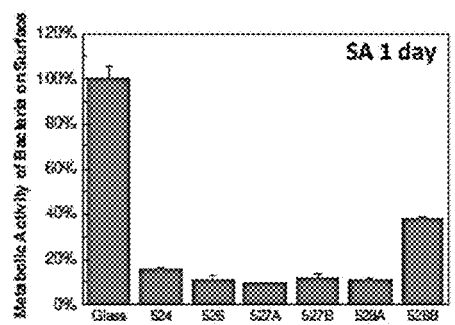
FIG. 4A depicts antifouling activity of a material formed according to embodiments of the invention.
Figure 4B:
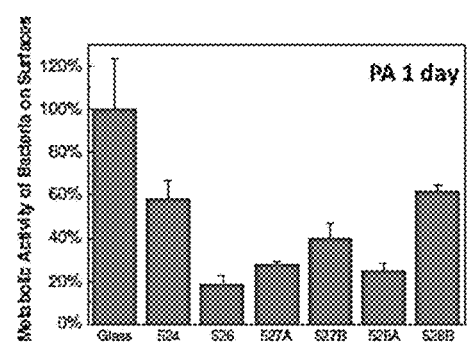
FIG. 4B depicts antifouling activity of a material formed according to embodiments of the invention.
Figure 4C:
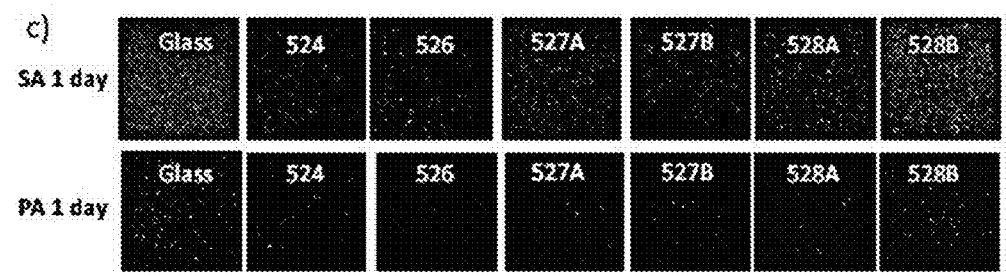
FIG. 4C depicts live/dead assays of a material formed according to embodiments of the invention.

The antifouling properties of nano-patterned PEI/PPO/glyoxal coatings and control non-nano-patterned PEI/glyoxal coatings were tested. Each coating was incubated for 24 hours with *Staphylococcus aureus* (SA) and *Pseudomonas aeruginosa* (PA). Metabolic activity of SA after being incubated with each coating is shown in FIG. 4A. Metabolic activity of PA with each coating is shown in FIG. 4B. Live/dead assays against SA (top) and PA (bottom) are shown in FIG. 4C.

All the tested coatings exhibited very good antifouling properties for both SA and PA, as compared to a control glass substrate. However, coating 526 (nano-patterned) demonstrated significantly better results as compared to the other non-nano-patterned coatings, including 524, 527 and 528, which were chemically-modified to induce chemical bacteria repulsion.

Glass substrates for these experiments were prepared as follows. 3 inch×2 inch glass slides were dipped in a surfactant solution overnight, rinsed with water and ethanol and dried. The slides were next treated by ultraviolet (UV)/ozone for 15 minutes. Clean slides were dipped in a 10% APTES solution in ethanol for 30 minutes and thoroughly rinsed with ethanol before drying. Aluminum tape (80 micrometer thickness) boundaries were next installed, and the slides were kept under nitrogen before spray coating.

PEI/PPO/glyoxal films were prepared by spray-coating as follows. Solution A was 2.5 wt % glyoxal solution in isopropanol/water. Solution A was prepared by diluting a 40 wt % aqueous solution with isopropanol and then transferring into a 22 milliliter-reservoir of a spray gun. Solution B was 0.563 grams PEI ($M_w$=1.8 k) and 0.225 grams JEFFAMINE D-4000 Polyetheramine D4000 (Huntsman Corporation, The Woodlands, Tex.) in 14 grams isopropanol. Solution B was transferred to the 22 milliter-reservoir of a second spray gun. The layers were sprayed successively on an APTES-functionalized glass substrate. The distance between the substrate and the nozzle was about 15 centimeters. Solution A was first applied, followed by solution B, until a total of 9 layers was reached (pressure=25 psi). The glass substrate was then transferred to a hot plate to cure. The following thermal treatments were used for curing: 30° C. for 1 hour, 30° C. to 120° C. for 1 hour, and 120° C. for 1 hour. The film was cooled to room temperature after curing.

Example 3

A hydrophobic polythioaminal was prepared. 4,4'-hexafluoroisopropylidene)dianiline and 1,6-hexanedithiol were reacted in equimolar ratios with an excess of paraformaldehyde (2.5 equivalents) at 85° C. After 18 hours, a polymeric material was formed, which resulted from the in-situ generation of a reactive imine intermediate that condensed with dithiol to form the polythioaminal (see reaction scheme in FIG. 5A).

Figure 5B:
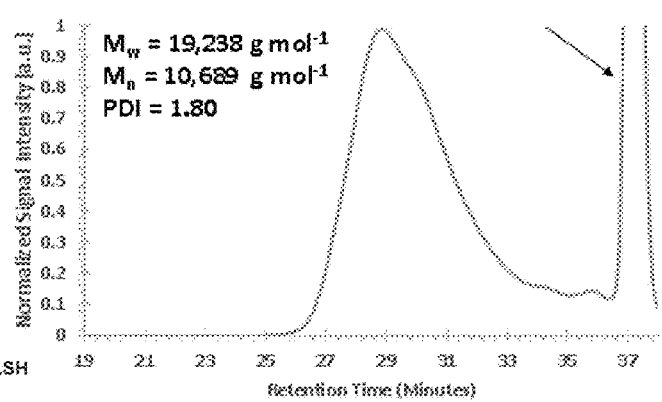
FIG. 5B depicts a gel permeation chromatography (GPC) trace of a material formed to embodiments of the invention.

FIG. 5B depicts a gel permeation chromatography (GPC) trace of the polymer that was formed. The polymer had a $M_w$ of 19,238 g mol$^{-1}$, a $M_n$ of 10,689 g mol$^{-1}$, and a polydispersity index (PDI) of 1.80.

Example 4

Figure 7:
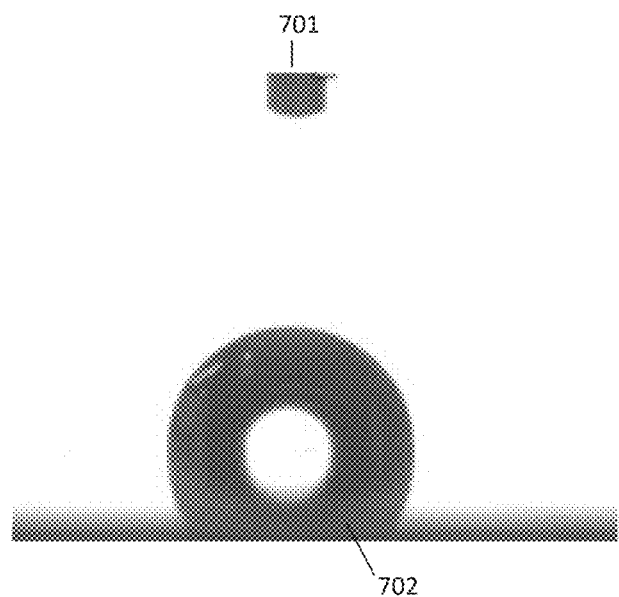
FIG. 7 depicts a method for measuring a contact angle of a material forming according to embodiments of the invention.

A fluorinated polythioaminal (shown in FIG. 6C) was spin-coated onto the surface of a substrate to form a linear polymer with a PDI of about 2. The polymer was heated to 110° C. to induce crosslinking and network formation (also as shown in FIG. 6C). The contact angle of the crosslinked, highly fluorinated polythioaminal network was then measured, as shown in FIG. 7. The contact angle without optimization of the network at 108° is shown. The roughness of the coating after spin-coating was not modified.

Example 5

A fluorinated polythioether was prepared as follows. A 8-mL scintillation vial equipped with a magnetic stir-bar was charged with 2,2,11,11-tetramethyl-3,10-dithia-2,11-disiladodecane (A in Scheme 2 above) (281 mg, 1.0 mmol) and dimethylformamide (DMF) (1.0 mL). Hexafluorobenzene was added, followed by TBD (14 mg, 10 mol %). Within 2 minutes, a white solid had precipitated from solution. Methanol (7 mL) was added to the reaction mixture, and the solid was collected by centrifugation and decanting the supernatant. This process was repeated two additional times to afford the desired polythioether polymer (B in Scheme 2) as a white solid.

The product was characterized as follows: $M_{n,SEC}$=20,200 g/mol, $M_{w,SEC}$=90,600 g/mol; Đ=4.5. $^1$H NMR (400 MHz, CDCl$_3$)=ä 2.92 (m, 4H), 1.56 (m, 4H), 1.41 (m, 4H).

Dynamic Mechanical Analysis (DMA) was performed. An N-methyl-2-pyrrolidone (NMP) solution of the fluorinated polythioether was prepared and drop-casted on a braid for DMA analysis. The samples (approximately 12×6×1 mm) were solicited using a dual cantilever with the following temperature program: (1) heating from −80° C. to 220° C. at a 5° C./minute heating rate, (2) cooling from 220° C. to −80° C., and (3) heating from −80° C. to 300° C. Alternatively, the polymerization of the fluorinated thioether material was performed on the braid and obtained material exhibited similar DMA traces.

Figure 8:
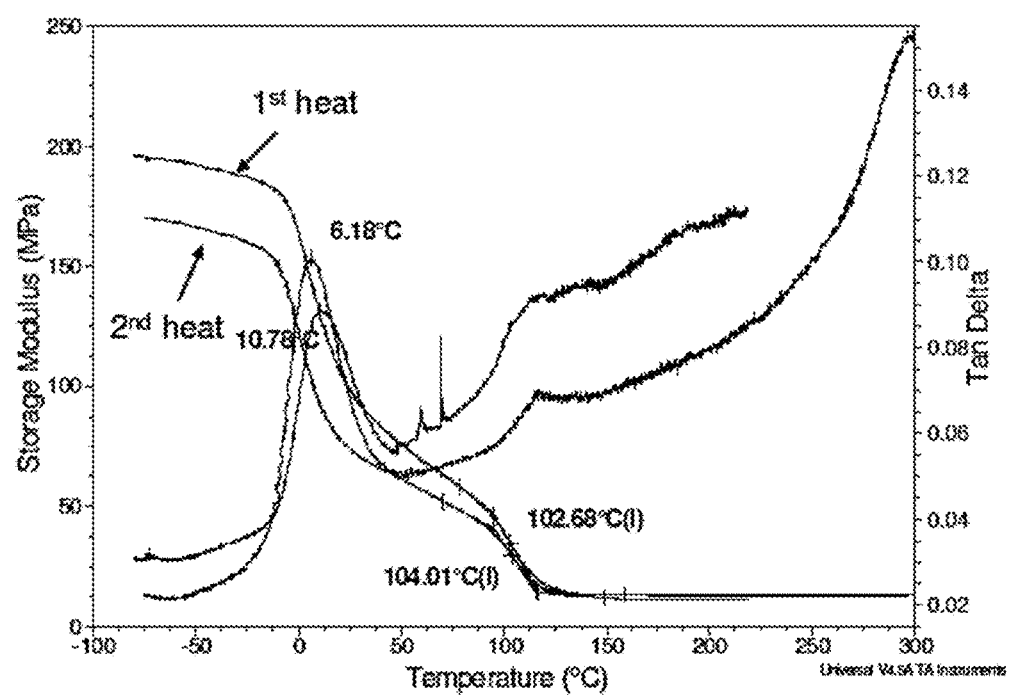
FIG. 8 depicts a graph of storage modulus as a function of temperature for a material formed according to embodiments of the invention.

FIG. 8 depicts the DMA results, which is a graph of storage modulus as a function of temperature for the fluorinated polythioether. As shown, the fluorinated polythioethers are semi-crystalline, demonstrating the requisite surface roughness and was opaqueness due to the spherical crystal structure.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of making an antifouling coating with tailorable surface topology, the method comprising:
    providing a mold with a pattern of indentions and protrusions;
    forming a layer of fluorinated poly(thioaminal) polymer on the pattern of indentions and protrusions of the mold;
    heating the layer of fluorinated poly(thioaminal) polymer to induce crosslinking and transfer the pattern into the layer of fluorinated poly(thioaminal) polymer; and
    removing the mold from the layer of fluorinated poly(thioaminal) polymer, the layer of fluorinated polythioaminal comprising a negative pattern of the mold.

2. The method of claim 1, wherein the layer of fluorinated poly(thioaminal) polymer is linear before heating.

3. The method of claim 1, wherein a polydispersity index (PDI) of the fluorinated poly(thioaminal) polymer before heating is about 2.

4. The method of claim 1, wherein forming the layer of fluorinated poly(thioaminal) polymer is by spin-coating.

5. The method of claim 1 further comprising forming the fluorinated poly(thioaminal) polymer by reacting a fluorinated dianiline and dithiol with paraformaldehyde.

6. The method of claim 5, wherein reacting the fluorinated dianiline and dithiol with paraformaldehyde in-situ forms an intermediate imine that reacts with the dithiol.

7. The method of claim 1, heating is at a temperature in a range from about 100 to about 200° C.

8. A method of making an antifouling coating with a textured surface, the method comprising:
    forming a fluorinated poly(thioether) polymer by a nucleophilic aromatic substitution reaction; and
    curing the fluorinated poly(thioether) polymer to provide a film that is semi-crystalline.

9. The method of claim 8, wherein the nucleophilic substitution reaction comprises a perfluoroarene reactant.

10. The method of claim 8, wherein the nucleophilic substitution reaction further comprises a dithiol.

11. The method of claim 9, where the nucleophilic substitution reaction further comprises an organic catalyst.

12. The method of claim 11, wherein the organic catalyst is triazabicyclodecene (TBD) or 1,8-diazabicyclo[5.4.0]undec-7-ene (DBU).

13. The method of claim 8, where the film is opaque.

14. A method of making an antifouling coating with a textured surface, the method comprising:
   forming a fluorinated poly(thioether) polymer by a nucleophilic aromatic substitution reaction; and
   curing the fluorinated poly(thioether) polymer to provide a film that is crystalline.

15. The method of claim 14, wherein the nucleophilic substitution reaction comprises a perfluoroarene reactant.

16. The method of claim 14, wherein the nucleophilic substitution reaction further comprises a dithiol.

17. The method of claim 14, where the nucleophilic substitution reaction further comprises an organic catalyst.

18. The method of claim 17, wherein the organic catalyst is triazabicyclodecene (TBD) or 1,8-diazabicyclo[5.4.0]undec-7-ene (DBU).

19. The method of claim 14, where the film is opaque.

20. The method of claim 14, wherein the fluorinated poly(thioether) polymer in the film has a glass transition temperature (Tg) in a range of about 50 to about 200° C.

\* \* \* \* \*